United States Patent
Ma et al.

(10) Patent No.: US 11,749,509 B2
(45) Date of Patent: Sep. 5, 2023

(54) TEMPERATURE CONTROL USING TEMPERATURE CONTROL ELEMENT COUPLED TO FARADAY SHIELD

(71) Applicants: Mattson Technology, Inc., Fremont, CA (US); Beijing E-Town Semiconductor Technology, Co., LTD, Beijing (CN)

(72) Inventors: Yorkman Ma, San Jose, CA (US); Dixit V. Desai, Pleasanton, CA (US)

(73) Assignees: BEIJING E-TOWN SEMICONDUCTOR TECHNOLOGY, CO., LTD, Beijing (CN); MATTSON TECHNOLOGY, INC., Fremont, CA (US)

( * ) Notice: Subject to any disclaimer, the term of this patent is extended or adjusted under 35 U.S.C. 154(b) by 701 days.

(21) Appl. No.: 15/896,124

(22) Filed: Feb. 14, 2018

(65) Prior Publication Data

US 2018/0240652 A1    Aug. 23, 2018

Related U.S. Application Data

(60) Provisional application No. 62/460,925, filed on Feb. 20, 2017.

(51) Int. Cl.
H01J 37/32    (2006.01)
H01L 21/67    (2006.01)

(52) U.S. Cl.
CPC ...... H01J 37/32522 (2013.01); H01J 37/321 (2013.01); H01J 37/3299 (2013.01);
(Continued)

(58) Field of Classification Search
CPC .......... H01J 37/32651; H01J 37/32522; H01J 37/20; H01J 37/09; H01J 37/32238;
(Continued)

(56) References Cited

U.S. PATENT DOCUMENTS 2,137,162 A  *  11/1938  Hile ................ H01R 13/5833
                                                 439/456
4,070,083 A  *   1/1978  DiPalma ............ H01R 13/562
                                                 439/445
(Continued)

FOREIGN PATENT DOCUMENTS

CN    104576278    4/2015
CN    104717817    6/2015
(Continued)

OTHER PUBLICATIONS

CN-104717817-A (english machine translation) (Year: 2015).*
(Continued)

*Primary Examiner* — Benjamin Kendall
*Assistant Examiner* — Kurt Sweely
(74) *Attorney, Agent, or Firm* — Dority & Manning, P.A.

(57) ABSTRACT

Plasma processing apparatus and methods are disclosed. In one example implementation, a plasma processing apparatus can include a processing chamber. The apparatus can include a pedestal located in the processing chamber configured to support a workpiece during processing. The apparatus can include a dielectric window forming at least a portion of the processing chamber. The apparatus can include an inductive coupling element located proximate the dielectric window. The inductive coupling element can be configured to generate a plasma in the processing chamber when energized with RF energy. The apparatus can include a Faraday shield located between the inductive coupling element and the processing chamber. The apparatus can include at least one temperature control element in thermal communication with the Faraday shield.

10 Claims, 7 Drawing Sheets

(52) U.S. Cl.
CPC ..... *H01J 37/32651* (2013.01); *H01J 37/3211* (2013.01); *H01J 37/32119* (2013.01); *H01L 21/67069* (2013.01)

(58) Field of Classification Search
CPC .. H01J 37/244; H01J 37/32082; H01J 37/321; H01J 37/32348; H01J 37/3441; H01J 37/3444; H01J 37/3211; H01J 37/32119; H01J 37/32532; H01J 37/32541; H01J 37/32559; H01J 37/3299; H01L 21/02274; H01L 21/67248; H01L 21/67069
See application file for complete search history.

(56) References Cited

U.S. PATENT DOCUMENTS

| | | | |
|---|---|---|---|
| 6,149,760 A * | 11/2000 | Hama | H01J 37/321 118/723 I |
| 6,177,646 B1 | 1/2001 | Okumura et al. | |
| 6,422,173 B1 | 7/2002 | Nakajima | |
| 8,920,600 B2 | 12/2014 | Godyak | |
| 2002/0100557 A1* | 8/2002 | Li | H01J 37/321 156/345.48 |
| 2004/0129221 A1* | 7/2004 | Brcka | H01J 37/32633 118/723 I |
| 2004/0194890 A1* | 10/2004 | Moroz | H01J 37/32082 156/345.48 |
| 2006/0174834 A1 | 8/2006 | Long et al. | |
| 2012/0152901 A1* | 6/2012 | Nagorny | H01J 37/321 216/68 |
| 2014/0020835 A1 | 1/2014 | Nguyen et al. | |
| 2014/0021861 A1 | 1/2014 | Carducci et al. | |
| 2014/0342568 A1* | 11/2014 | Sant | H01J 37/321 438/710 |
| 2015/0020969 A1* | 1/2015 | Sriraman | H01J 37/32963 156/345.24 |
| 2015/0191823 A1* | 7/2015 | Banna | H01J 37/32651 219/635 |

FOREIGN PATENT DOCUMENTS

| | | | |
|---|---|---|---|
| CN | 104717817 A | * | 6/2015 |
| JP | H10256238 | | 9/1998 |
| JP | 2015529938 | | 10/2015 |
| JP | 2016184727 | | 10/2016 |
| WO | WO2014014566 | | 1/2014 |

OTHER PUBLICATIONS

English machine translation of CN-104717817-A (Year: 2015).*
International Preliminary Report on Patentability for corresponding PCT Application No. PCT/US2018/018091, dated Aug. 29, 2019, 8 pages.
PCT International Search Results and Written Opinion for corresponding PCT Application No. PCT/US2018/018091, dated Jul. 12, 2018—11 pages.

* cited by examiner

TEMPERATURE CONTROL USING TEMPERATURE CONTROL ELEMENT COUPLED TO FARADAY SHIELD

PRIORITY CLAIM

The present application claims the benefit of priority of U.S. Provisional Application Ser. No. 62/460,925, titled "Temperature Control Using Heating Element Coupled to Faraday Shield," filed on Feb. 20, 2017, which is incorporated herein by referenced for all purposes.

FIELD

The present disclosure relates generally to plasma processing and, more particularly, to apparatus and methods for processing a workpiece using a plasma source.

BACKGROUND

Plasma processing tools can be used in the manufacture of devices such as integrated circuits, micromechanical devices, flat panel displays, and other devices. Plasma processing tools used in modern plasma etch applications are required to provide a high plasma uniformity and a plurality of plasma controls, including independent plasma profile, plasma density, and ion energy controls. Plasma processing tools can, in some cases, be required to sustain a stable plasma in a variety of process gases and under a variety of different conditions (e.g. gas flow, gas pressure, etc.).

SUMMARY

Aspects and advantages of the invention will be set forth in part in the following description, or may be obvious from the description, or may be learned through practice of the invention.

One example aspect of the present disclosure is directed to a plasma processing apparatus. The plasma processing apparatus can include a processing chamber. The apparatus can include a pedestal in the processing chamber configured to support a workpiece during processing. The apparatus can include a dielectric window forming at least a portion of the processing chamber. The apparatus can include an inductive coupling element located proximate the dielectric window. The inductive coupling element can be configured to generate a plasma in the processing chamber when energized with RF energy. The apparatus can include a Faraday shield located between the inductive coupling element and the processing chamber. The apparatus can include at least one temperature control element in thermal communication with the Faraday shield.

Variations and modifications can be made to example embodiments of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure to one of ordinary skill in the art is set forth more particularly in the remainder of the specification, including reference to the accompanying figures, in which.

DETAILED DESCRIPTION

Figure 1:
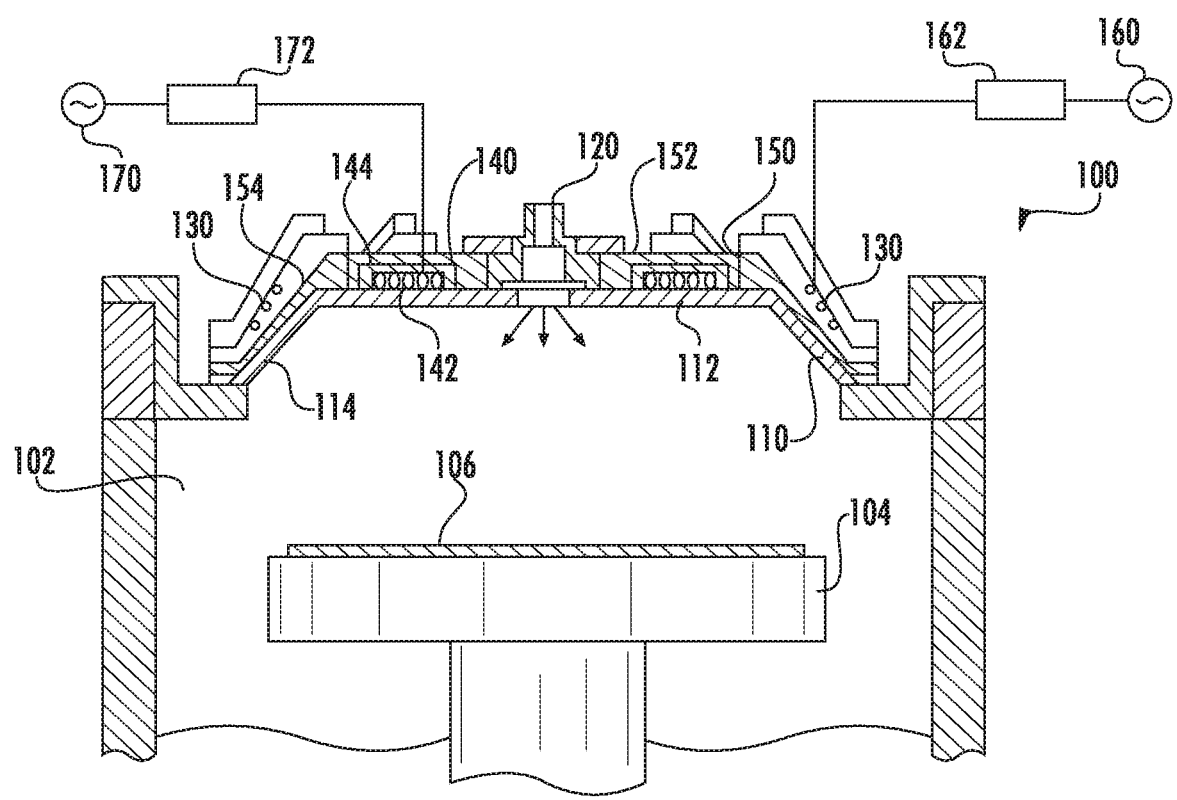
FIG. 1 depicts an example plasma processing apparatus according to example embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to a plasma processing apparatus and associated methods. The plasma processing apparatus can include one or more inductive coupling elements (e.g., coils) used to induce an inductive plasma within a processing chamber for processing a workpiece (e.g., performing an etch process). The plasma processing apparatus can include a Faraday shield arranged in the plasma processing apparatus to reduce capacitive coupling between the inductive coupling element(s) and the plasma induced in the processing chamber. According to example aspects of the present disclosure, one or more temperature control elements (e.g., heating elements) can be coupled in thermal communication with the Faraday shield.

For instance, in some embodiments, the one or more temperature control elements can include one or more heating elements, such as thin film heaters disposed on the Faraday shield. The one or more heating elements can be operated to control the temperature of one or more portions (e.g., a chamber ceiling) of the plasma processing apparatus, for instance, to reduce particulate generation created by plasma etch by-products during plasma processing and/or to pre-heat the chamber ceiling of the plasma processing apparatus to reduce cold start effects during plasma processing of a workpiece.

Aspects of the present disclosure are discussed with reference to one or more temperature control elements that include heating elements used to heat a Faraday shield. In variations of example embodiments of the present disclosure, the one or more temperature control elements can include cooling elements (e.g., fluid cooling channels).

In some embodiments, a thin film heating element (e.g., a polyimide thin film heater, silicone rubber sheet heater, etc.) can be provided on at least a portion of a surface of a Faraday shield used to reduce capacitive coupling in a plasma processing apparatus. In some embodiments, the thin film heating element can be placed in direct contact with the Faraday shield. For instance, the thin film heating element can be laminated to the Faraday shield, bonded to the Faraday shield, or otherwise placed in contact with the Faraday shield.

In some embodiments, the heating element can also be in contact with and/or adjacent to a dielectric window (e.g., a ceramic vessel) that serves as a ceiling for the processing chamber of the plasma processing apparatus. For instance, a spring ring and/or spring loaded block can be used to keep the heating element in contact with the dielectric window. In some embodiments, the heating element (when not energized or heated) can acts as a heat sink to provide a thermal conduction path between the dielectric window and the Faraday shield. In this way, the heating element can improve thermal regulation of the dielectric window. In some embodiments, a gap can be provided between the heating element and the dielectric window.

In some embodiments, one or more sets of conductors can be used to deliver power and/or other signals to and/or from the heating element. For instance, a first set of conductors can be used to provide power to the heating element. A second set of conductors can be provided to a thermocouple or other temperature sensing element(s) attached to or in proximity with the heating element. In some embodiments, multiple second sets of conductors can be provided to multiple temperature sensing elements arranged in different zones on the heating element. In some embodiments, the sets of conductors can pass through hollow tubes secured or otherwise coupled to the Faraday shield to reduce strain on the sets of conductors.

A control system can control the heating element(s) to maintain the heating element in a desired temperature range. For instance, one or more control devices can control power delivery (e.g., through a set of power conductors) to the heating element based on one or more feedback signals indicative of the temperature of the heating element from the temperature sensors (e.g., one or more sets of sensing conductors). In some embodiments, the Faraday shield can be used as a heat sink for cooling the heating element. For instance, power can be provided to the heating element until the heating element reaches a desired temperature (e.g., as determined from the feedback signals). Once the desired temperature is attained, power can be turned off to the heating element, allowing the heating element to cool via the Faraday shield acting as a heat sink. Once the temperature drops below a threshold, power can be supplied to the heating element, allowing the heating element to increase temperature to the desired temperature and/or to be within a desired temperature range.

A variety of different control schemes can be used without deviating from the scope of the present disclosure. For instance, in some embodiments, the temperature of the heating element can be controlled to be within a constant temperature range (e.g., between about 100° C. and about 180° C., such as between about 120° C. and about 150° C.).

In some embodiments, a temperature control system for the heating element can include a pair of sensing elements (e.g., a pair of thermocouples). A first thermocouple can be used to provide feedback signals to one or more control devices which can use the feedback signals to control the heating element to be at a temperature within a set temperature range. A second thermocouple can be used for over temperature shut off control. For instance, if the temperature of the heating element exceeds a threshold temperature, power to the heating element can be immediately turned off so that overheating is prevented.

In some embodiments, multiple different zones of the heating element(s) can be controlled independently of one another. For instance, the heating element(s) can include a central zone and a peripheral zone. The peripheral zone, in some embodiments, can be controlled to be at a higher temperature than the central zone, or vice versa.

One example aspect of the present disclosure is directed to a plasma processing apparatus. The apparatus includes a processing chamber. The apparatus includes a pedestal located in the processing chamber configured to support a workpiece during processing. The apparatus includes a dielectric window forming at least a portion of the processing chamber. The apparatus includes an inductive coupling element located proximate the dielectric window. The inductive coupling element is configured to generate a plasma in the processing chamber when energized with radio frequency (RF) energy. The apparatus can include a Faraday shield located between the inductive coupling element and the processing chamber. The apparatus can include at least one temperature control element in thermal communication with the Faraday shield.

Variations and modifications can be made to this example embodiment of the present disclosure. For instance, in some embodiments, the Faraday shield can be located between the inductive coupling element and the dielectric window. In some embodiments, the at least one temperature control element provides a thermally conductive path between the dielectric window and the Faraday shield.

In some embodiments, the at least one temperature control element can include a heating element. The heating element can be a thin film heating element. For instance, the heating element can be a polyimide thin film heating element or a silicon rubber thin film heating element.

In some embodiments, the heating element can have a shape that at least partially conforms to a shape of the Faraday shield. For instance, the Faraday shield can include one or more solid metal portions and a plurality of leaf elements. Each of the plurality of leaf elements can be coupled to at least one of the one or more solid metal portions via at least one radial spike element. The thin film heating element can include a plurality of leaf elements. Each leaf element can be coupled to a ring portion via at least one radial spike element.

In some embodiments, the apparatus can include a first set of conductors configured to provide power to the at least one temperature control element. The apparatus can include a second set of conductors. The second set of conductors can be associated with a temperature sensor configured to generate one or more signals indicative of a temperature associated with the at least one temperature control element. At least one of the first set of conductors or the second set of conductors can pass through a tube element coupled to the Faraday shield.

In some embodiments, the apparatus can include one or more control devices. The one or more control devices can be configured to control the delivery of power to the at least one temperature control element based at least in part on the one or more signals indicative of the temperature of the Faraday shield.

In some embodiments, the at least one temperature control element includes a first temperature control element disposed on a first portion of the Faraday shield and a second temperature control element disposed on a second portion of the Faraday shield. The first portion can be a central portion and the second portion can be a peripheral portion. In some embodiments, the first temperature control element can be independently controllable relative to the second temperature control element.

Another example embodiment of the present disclosure is directed to a plasma processing apparatus. The apparatus includes a processing chamber. The apparatus includes a pedestal located in the processing chamber configured to support a workpiece during processing. The apparatus includes a dielectric window forming at least a portion of the processing chamber. The apparatus includes an inductive coupling element located proximate the dielectric window. The inductive coupling element is configured to generate a plasma in the processing chamber when energized with radio frequency (RF) energy. The apparatus can include a Faraday shield located between the inductive coupling element and the dielectric window. The apparatus can include at least one heating element in thermal communication with the Faraday shield.

Variations and modifications can be made to this example embodiment. For instance, in some embodiments, the at least one heating element includes a first heating element disposed on a first portion of the Faraday shield and a second heating element disposed on a second portion of the Faraday shield. The first heating element and the second heating element can be independently controllable. The first portion can be a peripheral portion of the Faraday shield and the second portion can be a center portion of the Faraday shield. In some embodiments, the apparatus includes a power source configured to independently provide power to the first heating element and the second heating element.

In some embodiments, the apparatus includes one or more control devices. The one or more control devices can be configured to receive one or more signals indicative of a temperature associated with a first heating zone and one or more signals indicative of a temperature associated with the second heating zone. The one or more control devices can be configured to control power to the first heating element and the second heating element based at least in part on the one or more signals indicative of a temperature associated with the first heating zone and the one or more signals indicative of a temperature associated with a second heating zone.

Another example embodiment of the present disclosure is directed to a plasma processing apparatus. The apparatus includes a processing chamber. The apparatus includes a pedestal located in the processing chamber configured to support a workpiece during processing. The apparatus includes a dielectric window forming at least a portion of the processing chamber. The apparatus includes an inductive coupling element located proximate the dielectric window. The inductive coupling element is configured to generate a plasma in the processing chamber when energized with radio frequency (RF) energy. The apparatus can include a Faraday shield located between the inductive coupling element and the dielectric window. The apparatus can include at least one heating element in thermal communication with the Faraday shield. The apparatus can include one or more control devices configured to control delivery of power to the at least one heating element based at least in part on one or more signals from a temperature sensor.

Aspects of the present disclosure are discussed with reference to a "workpiece", "substrate", or "wafer" for purposes of illustration and discussion. Those of ordinary skill in the art, using the disclosures provided herein, will understand that the example aspects of the present disclosure can be used in association with any semiconductor substrate or other suitable substrate or workpiece. A "pedestal" is any structure that can be used to support a workpiece. In addition, the use of the term "about" in conjunction with a numerical value is intended to refer to within 10% of the stated numerical value.

FIG. 1 depicts a plasma processing apparatus 100 according to example embodiments of the present disclosure. The present disclosure is discussed with reference to the plasma processing apparatus 100 depicted in FIG. 1 for purposes of illustration and discussion. Those of ordinary skill in the art, using the disclosures provided herein, will understand that example aspects of the present disclosure can be used with other plasma processing tool and/or apparatus without deviating from the scope of the present disclosure.

The plasma processing apparatus 100 includes a processing chamber defining an interior space 102. A pedestal or substrate holder 104 is used to support a workpiece 106, such as a semiconductor wafer, within the interior space 102. A dielectric window 110 is located above the pedestal 104 and acts as a ceiling of the processing chamber. The dielectric window 110 includes a relatively flat central portion 112 and an angled peripheral portion 114. The dielectric window 110 includes a space in the central portion 112 for a showerhead 120 to feed process gas into the interior space 102.

The apparatus 100 further includes a plurality of inductive coupling elements, such as primary inductive coupling element 130 and secondary inductive coupling element 140, for generating an inductive plasma in the interior space 102. The inductive coupling elements 130, 140 can include a coil or antenna element that when supplied with RF energy, induces a plasma in the process gas in the interior space 102 of plasma processing apparatus 100. For instance, a first RF generator 160 can be configured to provide RF energy through a matching network 162 to the primary inductive coupling element 130. A second RF generator 170 can be configured to provide RF energy through a matching network 172 to the secondary inductive coupling element 140.

While the present disclosure makes reference to a primary inductive coupling element and a secondary inductive coupling element, those of ordinary skill in the art, should appreciate that the terms primary and secondary are used for convenience purposes only. The secondary inductive coupling element can be operated independently of the primary inductive coupling element. The primary inductive coupling element can be operated independently of the secondary inductive coupling element.

According to example aspects of the present disclosure, the apparatus 100 can include a metal shield portion 152 disposed around the secondary inductive coupling element 140. As discussed in more detail below, metal shield portion 152 separates the primary inductive coupling element 130 and the secondary inductive coupling element 140 to reduce cross-talk between the inductive coupling elements 130, 140. Apparatus 100 can further include a first Faraday shield 154 disposed between the primary inductive element 130 and the dielectric window 110. The first Faraday shield 154 can be a slotted metal shield that reduces capacitive coupling between the primary inductive coupling element 154 and the process chamber. As illustrated, the first Faraday shield 154 can fit over the angled portion of the dielectric window 110.

In some embodiments, metal shield 152 and the first Faraday shield 154 can form a unitary body 150 for ease of manufacturing and other purposes. The multi-turn coil of the primary inductive coupling element 130 can be located adjacent the Faraday shield portion 154 of the unitary body metal shield/Faraday shield 150. The secondary inductive coupling element 140 can be located proximate the metal shield portion 152 of metal shield/Faraday shield unitary body 150, such as between the metal shield portion 152 and the dielectric window 110.

The arrangement of the primary inductive coupling element 130 and the secondary inductive coupling element 140 on opposite sides of the metal shield 152 allows the primary inductive coupling element 130 and secondary inductive coupling element 140 to have distinct structural configurations and to perform different functions. For instance, the primary inductive coupling element 130 can include a multi-turn coil located adjacent a peripheral portion of the process chamber. The primary inductive coupling element 130 can be used for basic plasma generation and reliable start during the inherently transient ignition stage. The primary inductive coupling element 130 can be coupled to a powerful RF generator and auto-tuning matching network and can be operated at an increased RF frequency, such as at about 13.56 MHz.

The secondary inductive coupling element 140 can be used for corrective and supportive functions and for improving the stability of the plasma during steady state operation. Since the secondary inductive coupling element 140 can be used primarily for corrective and supportive functions and improving stability of the plasma during steady state operation, the secondary inductive coupling element 140 does not have to be coupled to as powerful of an RF generator as the first inductive coupling element 130 and can be designed differently and cost effectively. As discussed in detail below, the secondary inductive coupling element 140 can also be operated at a lower frequency, such as at about 2 MHz, allowing the secondary inductive coupling element 140 to be very compact and to fit in a limited space on top of the dielectric window.

The primary inductive coupling element 130 and the secondary inductive coupling element 140 can be operated at different RF frequencies. The RF frequencies can be sufficiently different to reduce cross-talk between the primary inductive coupling element 130 and the secondary inductive coupling element 140. For instance, the frequency applied to the primary inductive coupling element 130 can be at least about 1.5 times greater than the frequency applied to the secondary inductive coupling element 140. In some embodiments, the frequency applied to the primary inductive coupling element 130 can be about 13.56 MHz and the frequency applied to the secondary inductive coupling element 140 can be in the range of about 1.75 MHz to about 2.15 MHz. Other suitable frequencies can also be used, such as about 400 kHz, about 4 MHz, and about 27 MHz.

While the present disclosure is discussed with reference to the primary inductive coupling element 130 being operated at a higher frequency relative to the secondary inductive coupling element 140, those of ordinary skill in the art, using the disclosures provided herein, should understand that the secondary inductive coupling element 140 could be operated at the higher frequency without deviating from the scope of the present disclosure.

The secondary inductive coupling element 140 can include a planar coil 142 and a magnetic flux concentrator 144. The magnetic flux concentrator 144 can be made from a ferrite material. Use of a magnetic flux concentrator 144 with a planar coil 142 can give high plasma coupling and good energy transfer efficiency of the secondary inductive coupling element 140, and can significantly reduce its coupling to the metal shield 150. Use of a lower frequency, such as about 2 MHz, on the secondary inductive coupling element 140 can increase skin layer, which also improves plasma heating efficiency.

According to example aspects of the present disclosure, the different inductive coupling elements 130 and 140 can carry different functions. Specifically, the primary inductive coupling element 130 can be used to carry out the basic functions of plasma generation during ignition and providing enough priming for the secondary inductive element 140. The primary inductive coupling element 130 can have coupling to both plasma and the grounded shield to stabilize plasma potential. The first Faraday shield 154 associated with the first inductive coupling element 130 can reduce window sputtering and can be coupled to the ground.

Additional coils can be operated in the presence of good plasma priming provided by the primary inductive coupling element 130 and as such, preferably have good plasma coupling and good energy transfer efficiency to plasma. A secondary inductive coupling element 140 that includes a magnetic flux concentrator 144 provides both a good transfer of magnetic flux to plasma volume and at the same time a good decoupling of the secondary inductive element 140 from the surrounding metal shield 150. The use of magnetic flux concentrators 144 and symmetric driving of the secondary conductive element 140 further reduces the amplitude of the voltage between coil ends and surrounding grounded elements. This can reduce sputtering of the dome, but at the same time gives some small capacitive coupling to plasma, which can be used to assist ignition.

Figure 2:
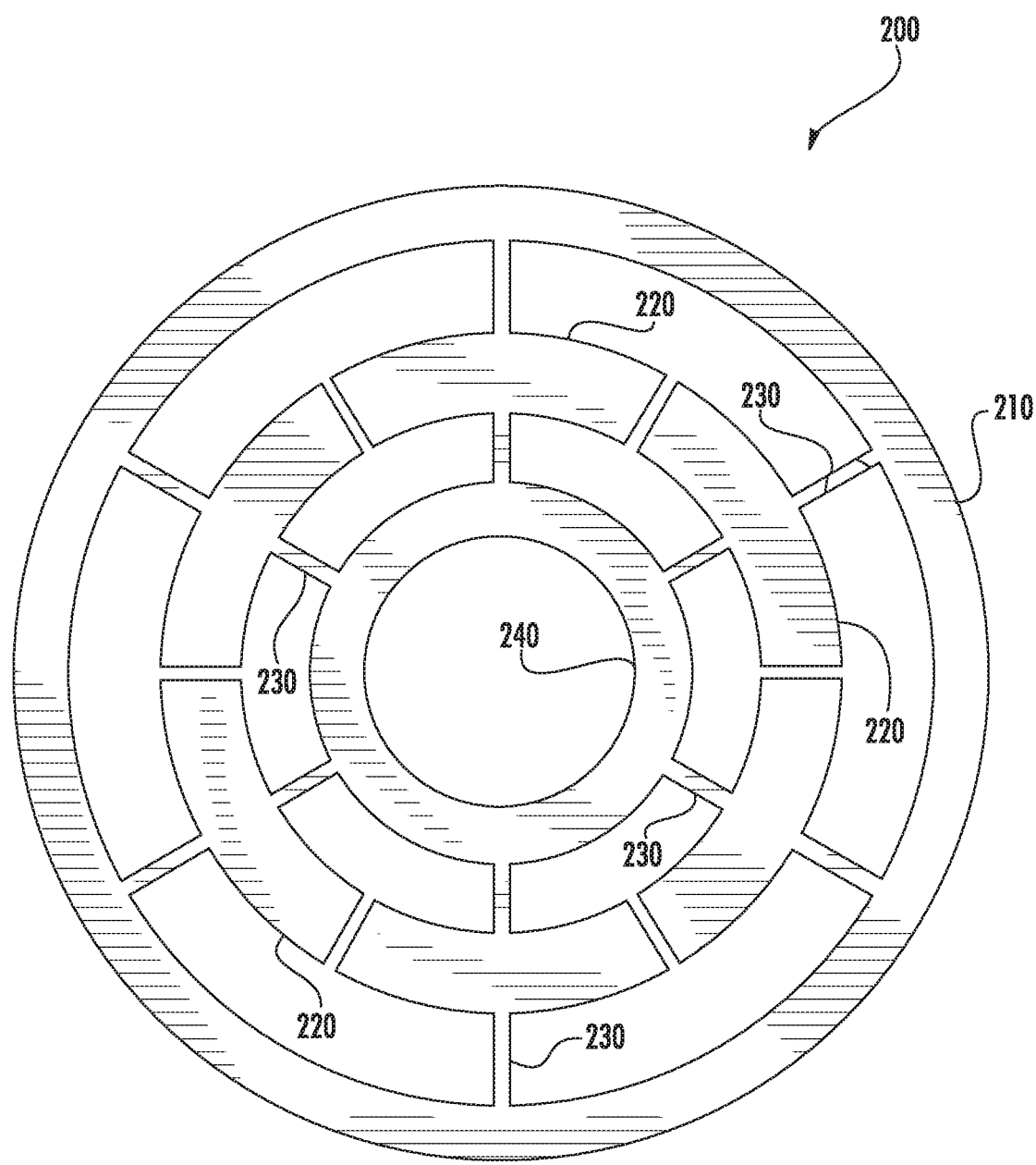
FIG. 2 depicts a plan view of an example Faraday shield that can be used in conjunction with a plasma processing apparatus according to example embodiments of the present disclosure.

In some embodiments, a second Faraday shield 200 can be used in combination with this secondary inductive coupling element 140 to reduce capacitive coupling of the secondary inductive element 140. FIG. 2 depicts an example second Faraday shield 200 that can be used in a plasma processing apparatus according to example embodiments of the present disclosure. The Faraday shield 200 can be stamped out of a thin (0.25-0.5 mm) sheet metal. The Faraday shield 200 can include, for instance, one or more solid metal portions, such as a first portion 210 of solid metal and/or a second portion 240 of solid metal. The Faraday shield 200 can include a plurality of leaf elements 220 that can be positioned to cover the planar coil 142. Radial spike elements 230 connect the leaf elements 220 with portions 210 and 240 of the Faraday shield 200.

Figure 3:
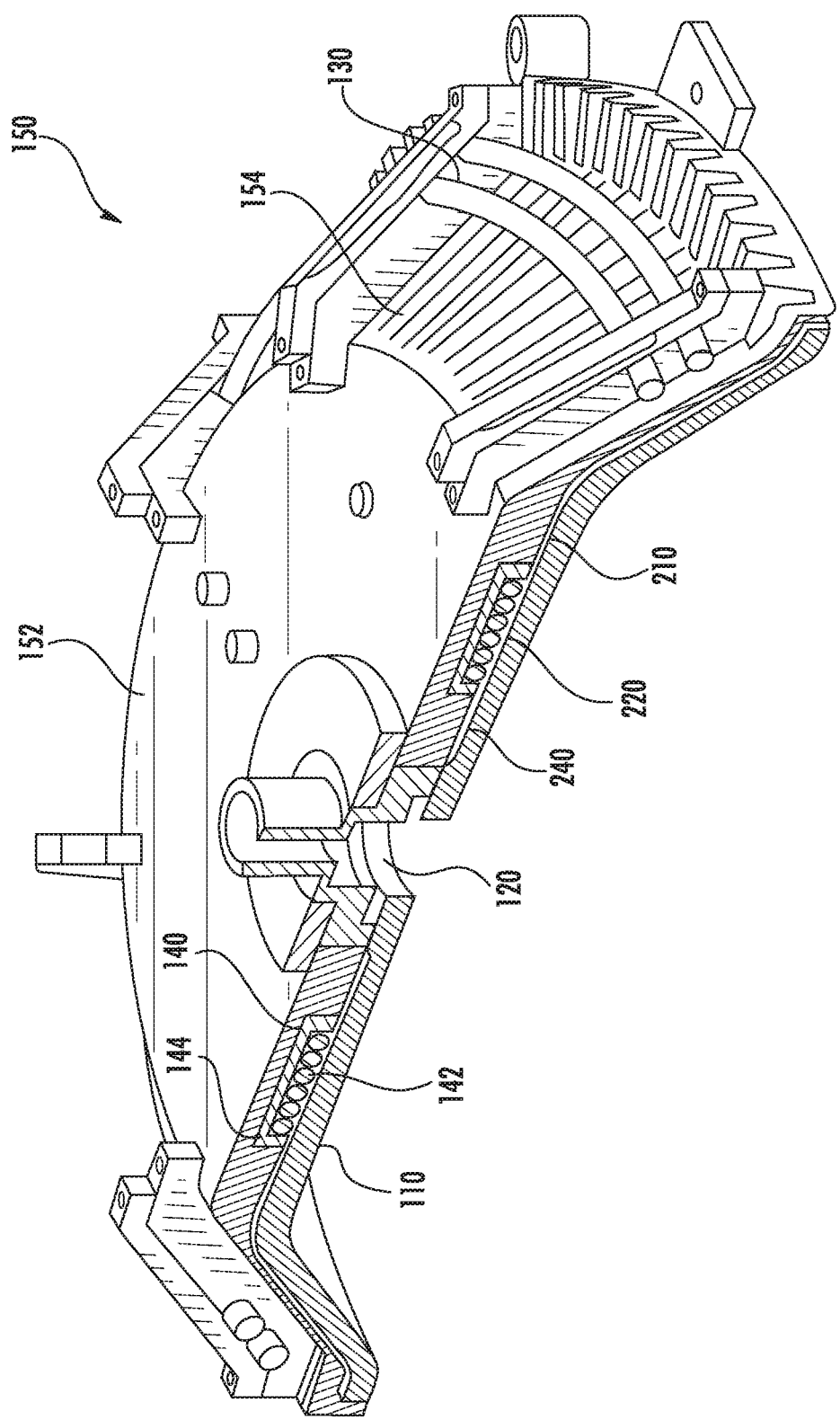
FIG. 3 depicts an example Faraday shield disposed relative to the plasma processing apparatus according to example embodiments of the present disclosure.

Since the leaf elements 220 are parallel to the planar coil 142 and do not cover the magnetic flux concentrator 144, the leaf-type elements 220 do not interfere with magnetic field and magnetic flux from the magnetic flux concentrator 144 freely enters the plasma. On the other hand, the spikes 230 connecting all the leaf-type elements 220 with surrounding portions 210 and 240, do cross the flux coming out of the magnetic flux concentrators 144 but they have very small total area to interfere with the magnetic field. If grounding of the Faraday shield 200 is preferred, a thin RF ground spiral can be placed on the first portion 210 and/or second portion 240 of the shield to connect it to the main shield 150. One possible placement of the Faraday shield 200 is shown in FIG. 3, indicating position of elements 210, 220, and 240 in the assembly.

Figure 4:
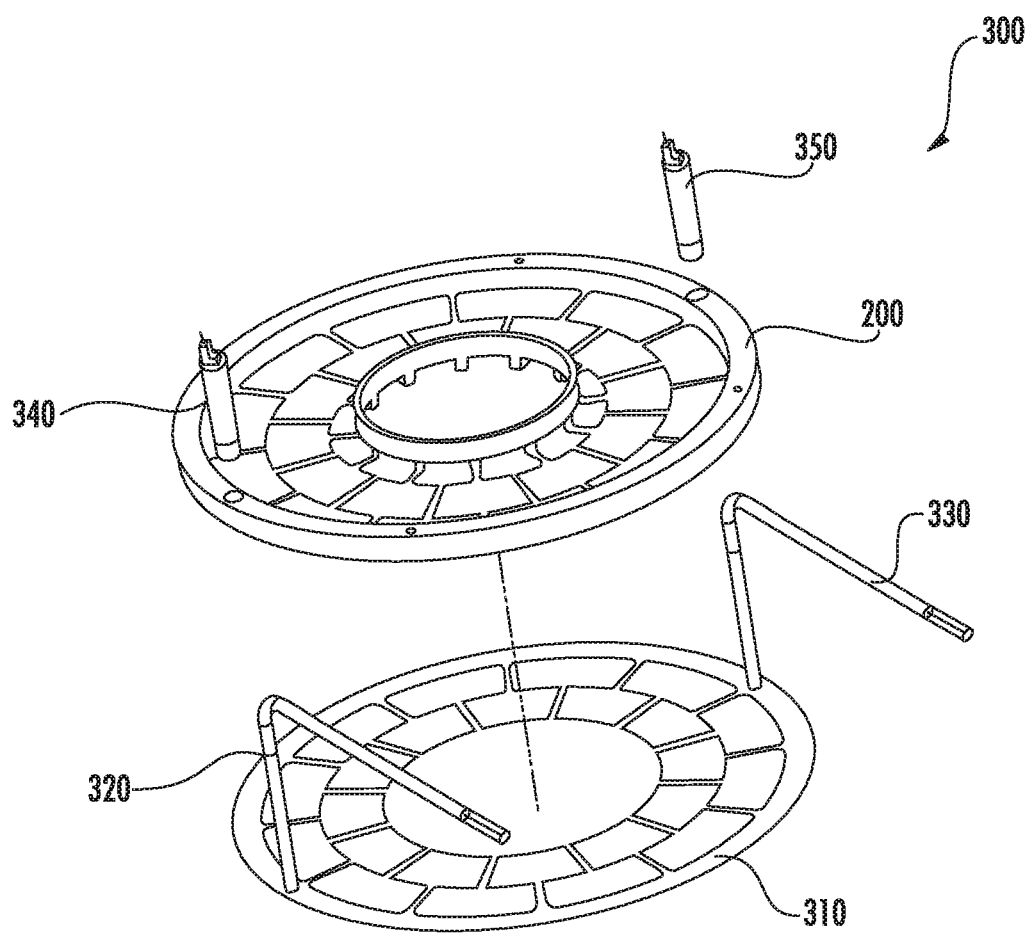
FIG. 4 depicts an exploded view of an example Faraday shield with a temperature control element according to example embodiments of the present disclosure.
Figure 5:
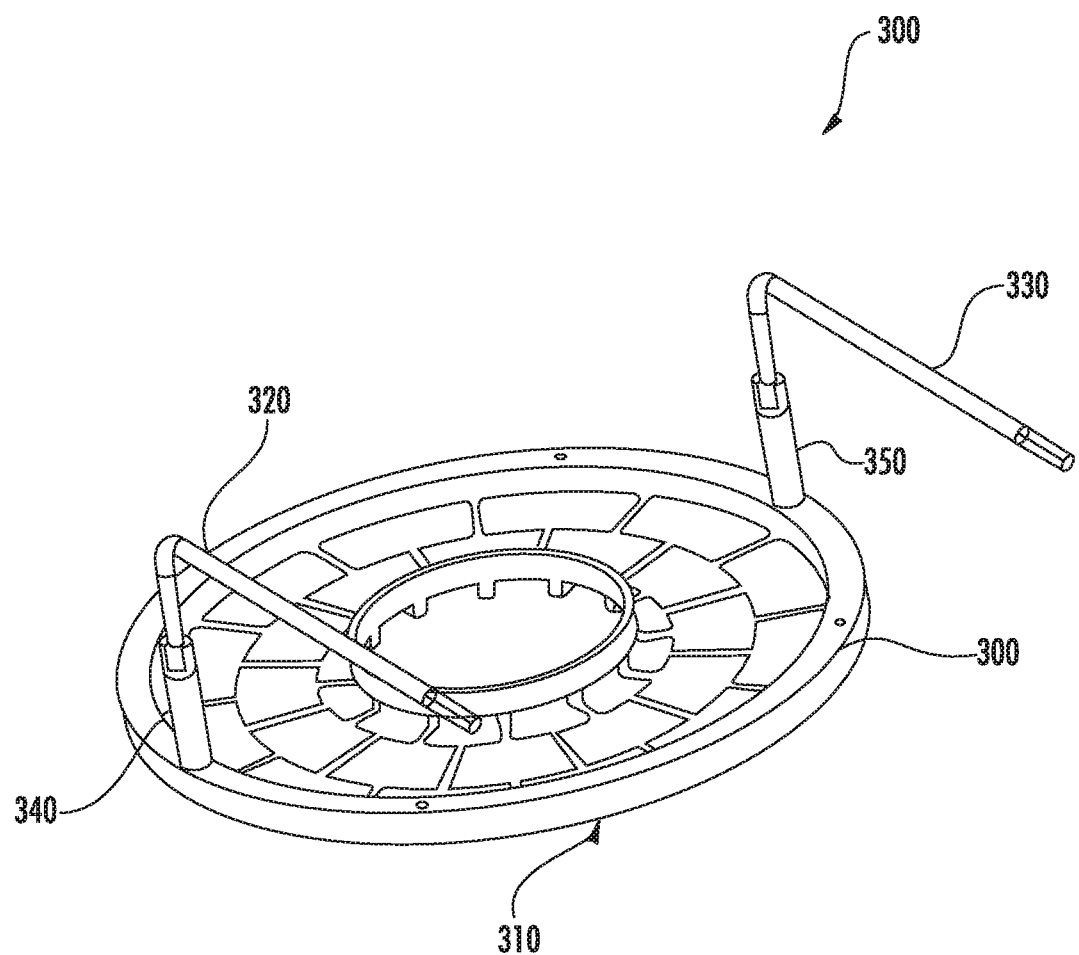
FIG. 5 depicts an example Faraday shield with a temperature control element according to example embodiments of the present disclosure.

According to example embodiments of the present disclosure, a temperature control element, such as a heating element, can be coupled to the Faraday shield 200. For instance, FIG. 4 depicts an exploded view of a Faraday shield assembly 300 that includes a heating element 310 coupled to the Faraday shield 200. FIG. 5 depicts a perspective view of Faraday shield assembly 300 that includes heating element 310 coupled to the Faraday shield 200. As depicted in FIGS. 4 and 5, the heating element 310 can have a shape that conforms to a shape of at least a portion of a surface of the Faraday shield 200. For instance, the heating element 310 can have leaf elements, radial spike portions, and ring portions that conform to the leaf-type elements, radial spike elements, and metal portions of the Faraday shield 200. In some embodiments, the heating element 310 can be laminated to the Faraday shield 200, bonded to the Faraday shield 200, or otherwise placed in contact with the Faraday shield 200.

The heating element 310 can be, for instance, a thin film heating element. In some embodiments, the heating element 310 can be a polyimide thin film heating element. In some embodiments, the thin film heating element can be a silicon rubber sheet heating element. The heating element 310 can be configured to heat up when electrical power is provided to the heating element. For instance, electrical current travelling through the heating element 310 can cause heating of the heating element 310. When electrical current is not travelling through the heating element 310, the Faraday shield 200 can act as a heatsink causing the heating element 310 to cool.

When installed in the plasma processing apparatus 100, the heating element 310 can be in contact with and/or adjacent to the dielectric window 110 that forms a part of the chamber ceiling. For instance, a spring ring and/or spring loaded block can be used to keep the heating element in contact with the dielectric window 110. In some embodiments, a gap can be provided between the heating element 310 and the dielectric window 110.

In some embodiments, the heating element 310, when not heated, can provide a thermally conductive path between the dielectric window 110 and the Faraday shield 200. For instance, when the heating element 310 is not energized with electrical energy for heating, the heating element 310 can provide a cooling path to transfer heat from the dielectric window 110 to the Faraday shield 200. In this way, the heating element 310 in some instances can act as a heat sink to facilitate cooling of the dielectric window 110.

In this way, the heating element 310 can be used to control the temperature of the chamber ceiling for a variety of purposes, such as to reduce particulate generation created by plasma etch by-products during a plasma etch process. In some embodiments, the heating element 310 can be used to pre-heat the chamber ceiling of the plasma processing apparatus to reduce cold start effects during plasma processing.

Referring to FIGS. 4 and 5, the Faraday shield assembly 300 can include multiple sets of conductors coupled to the heating element 310. For instance, a first set of conductors 320 can be coupled to the heating element 310. The first set of conductors 320 can deliver electrical power to the heating element 310. A second set of conductors 330 can be coupled to the heating element 310 or near the heating element 310. The second set of conductors 330 can be associated with a temperature sensing device (e.g., a thermocouple). Signals indicative of a temperature of the heating element 310 can be communicated to a remote device (e.g., one or more control devices) via the second set of conductors 330.

The first set of conductors 320 can be provided through a tube element 340 coupled to the Faraday shield 200. The second set of conductors 330 can be provided through a tube element 350 coupled to the Faraday shield 200. The tube element 340 and the tube element 350 can reduce strain on the first set of conductors 320 and the second set of conductors 330 respectively.

In some embodiments, the first set of conductors 320 can be coupled to a power source (e.g., an AC power source) via a suitable connector, such as a plug-in connector. In some embodiments, the second set of conductors 330 can be coupled to one or more control devices (e.g., a controller) via a suitable connector, such as a plug-in connector.

Figure 6:
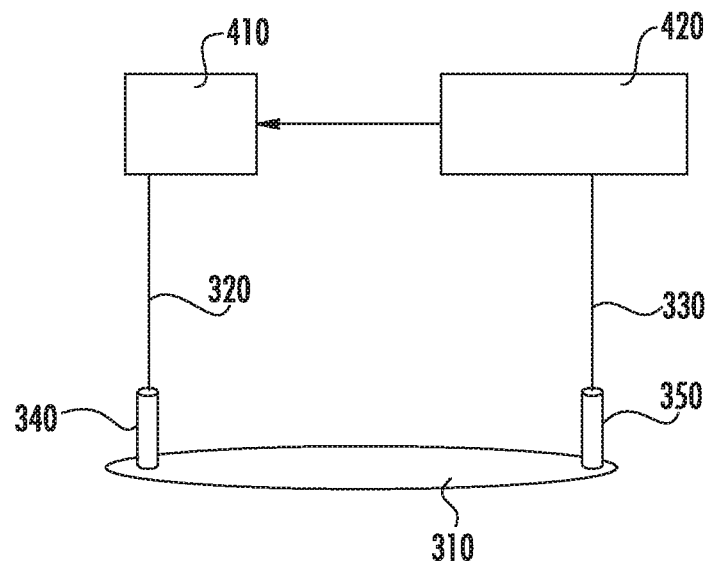
FIG. 6 depicts an example system for controlling a temperature control element coupled to a Faraday shield according to example embodiments of the present disclosure.

FIG. 6 depicts a block diagram of an example system for controlling a heating element 310 coupled to the Faraday shield 200 according to example embodiments of the present disclosure. As shown, the heating element 310 can receive electrical power from a power source 410 (e.g., an AC power source or a DC power source). The power source 410 can be a standalone power source or can be a part of the electrical power system of the plasma processing apparatus (e.g., a AC bus located in the power system of the plasma processing apparatus). The power source 410 can deliver power to the heating element 310 via conductors 320. The conductors 320 can pass through a tube element 340 coupled to the Faraday shield 200.

The system can include a control device 420 (e.g., a controller, microcontroller, microprocessors, logic device, application specific integrated circuit, etc.). In some embodiments, the control device 420 can include one or more processors and one or more memory devices. The one or more processors can execute computer-readable instructions stored in the one or more memory devices to perform operations. The operations can include, for instance, any of the control operations discussed herein. The control device 420 can, in some embodiments, be a standalone controller associated with the heating element 310 or can be or be a part of an overall system controller/control system associated with the plasma processing apparatus.

In some embodiments, the control device 420 can control the power source 410 to operate the heating element 310 according to a variety of control schemes. The control device 420 can receive signals indicative of a temperature of the heating element 310 via, for instance, conductors 330. Conductors 330 can pass through a tube element 350 coupled to the Faraday shield to reduce strain. The control device 420 can control a power source 410 to control the delivery of power to the heating element 310 based at least in part on the signal indicative of the temperature of the heating element 310 to provide a closed loop control scheme.

For instance, in one example embodiment, the control device 420 can control the heating element to be within a set temperature range. The temperature range can be, in some embodiments, between about 100° C. and about 180° C., such as between about 120° C. and about 150° C. The control device 420 can control the power source 410 to provide power (e.g., close a switching element, contactor, relay, transistor, etc.) to the heating element 310 when the temperature is below a first temperature set point. Once the temperature reaches the first temperature set point, the control device 420 can control the power source 410 to turn off power (e.g., open a switching element, contactor, relay, transistor, etc.) so that the heating element 310 cools via the Faraday shield acting as a heat sink. If the temperature drops below a second threshold that is lower than or the same as the first threshold, the control device 420 can control the power source 410 to provide power to the heating element 310.

The control device 420 can control the temperature of the heating element for a variety of purposes. For instance, the control device 420 can control the temperature of the heating element to heat the dielectric window located adjacent to the heating element to reduce particulate generation created by plasma etch by-products during plasma processing and/or to pre-heat the chamber ceiling of the plasma processing apparatus to reduce cold start effects during plasma processing.

Other control schemes are contemplated by the present disclosure. For instance, the control device 420 can be configured to operate the power source 410 using an open loop control scheme without deviating from the scope of the present disclosure.

Figure 7:
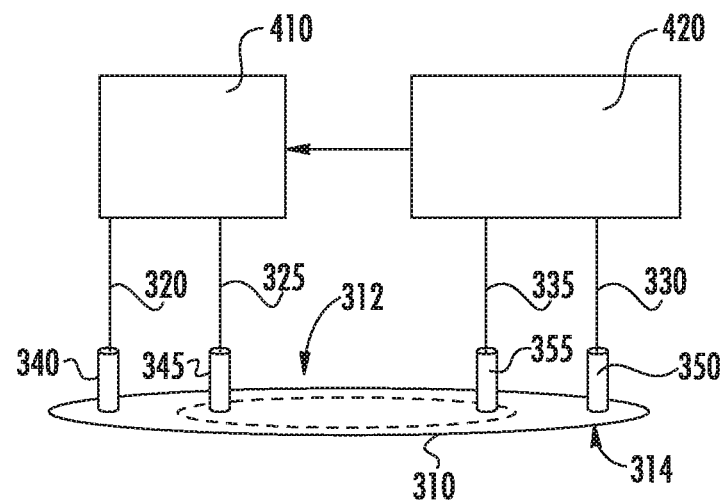
FIG. 7 depicts an example system for controlling a temperature control element coupled to a Faraday shield according to example embodiments of the present disclosure.

FIG. 7 depicts an example system for controlling multiple heating zones disposed on a Faraday shield according to example embodiments of the present disclosure. More particular, a heating element 310 can include multiple heating zones, including a central heating zone 312 and a peripheral heating zone 314. In some embodiments, each heating zones 312 and 314 can include a separate heating element that is independently controllable relative to the other zones. Two heating zones are illustrated in FIG. 7. However, more heating zones/independently controlled heating elements can be used without deviating from the scope of the present disclosure. The zones can be divided in any suitable fashion, such as radially and/or azimuthally.

Power source 410 (e.g., AC power source) can be configured to independently provide power to heating elements in the heating zone 312 and peripheral zone 314 so that the temperature of heating zone 312 and peripheral zone 314 is independently controllable relative to other zones. For instance, conductors 320 can provide power to a heating element in heating zone 314. The conductors 320 can pass through tube element 340 coupled to the Faraday shield. Conductors 325 can provide power to a heating element in heating zone 312. The conductors 325 can pass through a tube element 345 coupled to the Faraday shield.

The control device 420 can receive signals indicative of the temperature of each zone. For instance, signals indicative of the temperature of the heating zone 314 can be provided from a temperature sensing device (e.g., a thermocouple) to the control device 420 via conductors 330. Conductors 330 can pass through a tube element 350 coupled to the Faraday shield. Signals indicative of the temperature of the heating zone 312 can be provided from a temperature sensing device (e.g., a thermocouple) to the control device 420 via conductors 335. Conductors 335 can pass through a tube element 355 coupled to the Faraday shield.

The signals indicative of the temperature of the zones 312 and 314 can be used by the control device 420 to independently control the temperature of the zones 312 and 314 to achieve a desired temperature profile for the heating element. As an example, the control device 420 can control the temperature of the central zone 312 to be higher than the peripheral zone 314 or vice versa.

Figure 8:
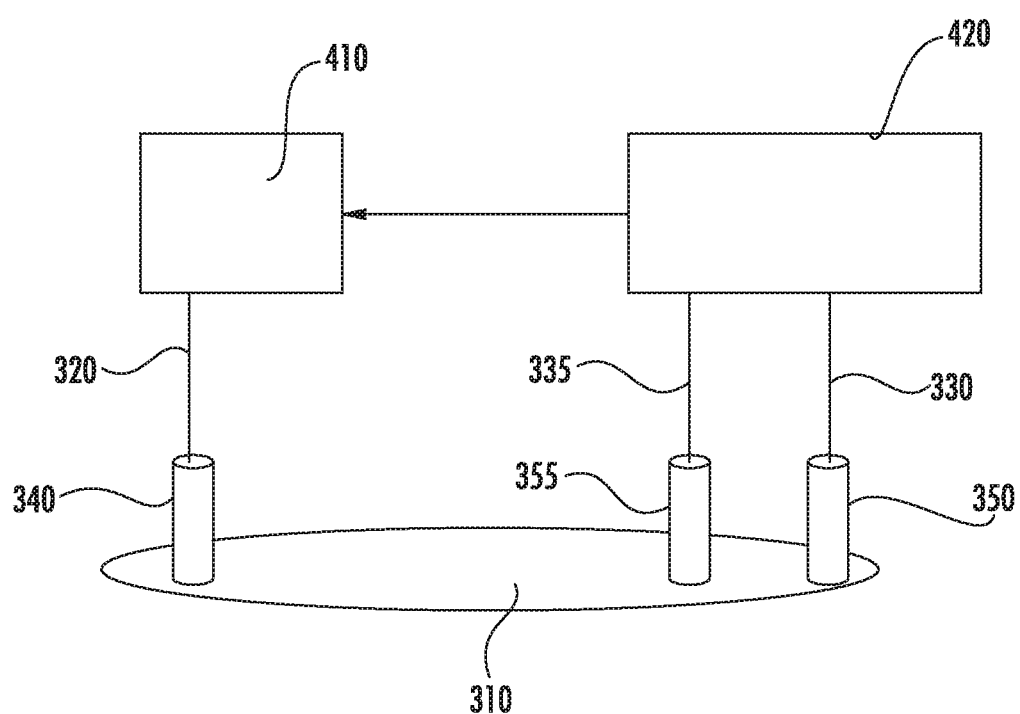
FIG. 8 depicts an example system for controlling a temperature control element coupled to a Faraday shield according to example embodiments of the present disclosure.

FIG. 8 depicts a block diagram of an example system for controlling a heating element 310 coupled to the Faraday shield 200 according to example embodiments of the present disclosure. A power source 410 can be configured to provide power to the heating element 310 via conductors 320. The conductors 320 can pass through a tube element 340 coupled to the Faraday shield.

A control device 420 can receive signals from a plurality of different temperature sensing elements. For instance, conductors 330 can provide signals indicative of the temperature of the heating element from a first temperature sensing device (e.g., a thermocouple) to the control device 420. Conductors 330 can pass through a tube element 350 coupled to the Faraday shield. Conductors 335 can provide signals indicative of the temperature of the heating element from a second temperature sensing device (e.g., a thermocouple) to the control device 420.

The control device 420 can be configured to use signals from the first temperature sensing device as feedback signals for closed loop control of the temperature of the heating element. Signals from the second temperature sensing device can be used as a failsafe. For instance, the control device 420 can control the power source 410 to immediately cease providing power to the heating element 410 if the signals from the second temperature sensing device are indicative of a temperature greater than a threshold.

The temperature sensing devices (e.g., thermocouples) are discussed herein with reference to measuring a temperature of the heating element. The temperature sensing device can measure the temperature of other aspects of the plasma processing apparatus (e.g., the dielectric window, the Faraday shield) and the control device can be configured to control the heating element based on such temperature measurements without deviating from the scope of the present disclosure.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A plasma processing apparatus, comprising:
a processing chamber;
a pedestal located in the processing chamber configured to support a workpiece during processing;
a dielectric window forming at least a portion of the processing chamber, the dielectric window comprising a first portion and a second portion;
a first inductive coupling element and a second inductive coupling element located proximate the dielectric window, the first inductive coupling element being adjacent the first portion of the dielectric window and the second inductive coupling element being adjacent the second portion of the dielectric window, the first and second inductive coupling elements configured to generate a plasma in the processing chamber when energized with radio frequency (RF) energy;
a first Faraday shield located between the first inductive coupling element and the processing chamber;
a second Faraday shield located between the second inductive coupling element and the processing chamber; and
at least one temperature control element in thermal communication with the second Faraday shield;
wherein the at least one temperature control element comprises a thin film heating element disposed on a surface of the second Faraday shield, and wherein each of the at least one temperature control element is in direct contact with the second portion of the dielectric window and spaced apart from the first portion of the dielectric window, the thin film heating element providing a cooling path to transfer heat from the dielectric window to the second Faraday shield when the thin film heating element is not heated, thereby acting as a heat sink to facilitate cooling of the dielectric window.

2. The plasma processing apparatus of claim 1, wherein the second Faraday shield is located between the second inductive coupling element and the second portion of the dielectric window.

3. The plasma processing apparatus of claim 1, wherein the at least one temperature control element provides a thermally conductive path between the dielectric window and the second Faraday shield.

4. The plasma processing apparatus of claim 1, wherein the thin film heating element is a polyimide thin film heating element or is a silicon rubber sheet heating element.

5. The plasma processing apparatus of claim 1, wherein the thin film heating element has a shape that at least partially conforms to a shape of the second Faraday shield.

6. The plasma processing apparatus of claim 5, wherein the second Faraday shield comprises one or more solid metal portions and a plurality of leaf elements, each of the plurality of leaf elements coupled to at least one of the one or more solid metal portions via at least one radial spike element, the thin film heating element comprising a plurality of leaf elements, each leaf element coupled to a ring portion via at least one radial spike element.

7. The plasma processing apparatus of claim 1, wherein the apparatus comprises:
   a first set of conductors configured to provide power to the at least one temperature control element; and
   a second set of conductors, the second set of conductors associated with a temperature sensor configured to generate one or more signals indicative of a temperature associated with the at least one temperature control element.

8. The plasma processing apparatus of claim 7, wherein at least one of the first set of conductors or the second set of conductors pass through a tube element coupled to the second Faraday shield.

9. The plasma processing apparatus of claim 1, wherein the apparatus comprises one or more control devices configured to control the delivery of power to the at least one temperature control element based at least in part on one or more signals indicative of the temperature of the second Faraday shield.

10. A plasma processing apparatus, comprising:
   a processing chamber;
   a pedestal located in the processing chamber configured to support a workpiece during processing;
   a dielectric window forming at least a portion of the processing chamber;
   an inductive coupling element located proximate the dielectric window, the inductive coupling element configured to generate a plasma in the processing chamber when energized with radio frequency (RF) energy;
   a Faraday shield located between the inductive coupling element and the processing chamber; and
   at least one temperature control element in thermal communication with the Faraday shield, and
   wherein the at least one temperature control element comprises a thin film heating element disposed on a surface of the Faraday shield and is in direct contact with the dielectric window, the thin film heating element providing a cooling path to transfer heat from the dielectric window to the Faraday shield when the thin film heating element is not heated, thereby acting as a heat sink to facilitate cooling of the dielectric window.

* * * * *